(12) United States Patent
Smith et al.

(10) Patent No.: US 9,863,041 B2
(45) Date of Patent: Jan. 9, 2018

(54) INTERNALLY HEATED POROUS FILTER FOR DEFECT REDUCTION WITH LIQUID OR SOLID PRECURSORS

(71) Applicant: Lam Research Corporation, Fremont, CA (US)

(72) Inventors: Colin F. Smith, Half Moon Bay, CA (US); Edward Sung, Fremont, CA (US); Kevin Madrigal, Santa Cruz, CA (US); Shawn Hamilton, Boulder Creek, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 314 days.

(21) Appl. No.: 14/876,870

(22) Filed: Oct. 7, 2015

(65) Prior Publication Data

US 2016/0102398 A1 Apr. 14, 2016

Related U.S. Application Data

(60) Provisional application No. 62/061,342, filed on Oct. 8, 2014.

(51) Int. Cl.
*C23C 16/44* (2006.01)
*B01D 46/42* (2006.01)
*H01J 37/32* (2006.01)

(52) U.S. Cl.
CPC ...... *C23C 16/4402* (2013.01); *B01D 46/4263* (2013.01); *H01J 37/3244* (2013.01); *Y10S 55/05* (2013.01); *Y10S 55/10* (2013.01); *Y10S 55/30* (2013.01)

(58) Field of Classification Search
CPC ............ C23C 16/4402; B01D 46/4263; B01D 2265/06; H01J 37/3244; F01N 3/027
See application file for complete search history.

(56) References Cited

U.S. PATENT DOCUMENTS

| | | | | |
|---|---|---|---|---|
| 5,571,298 A * | 11/1996 | Buck | ...................... | B01D 39/12 422/174 |
| 5,611,831 A * | 3/1997 | Matsuoka | .......... | B01D 39/2003 55/486 |
| 5,655,366 A * | 8/1997 | Kawamura | ........... | F01N 3/0212 55/487 |
| 6,013,118 A * | 1/2000 | Matsunuma | ......... | B01D 46/002 55/282.3 |
| 6,344,118 B1 * | 2/2002 | Kobayashi | ......... | G01N 27/4075 204/421 |

(Continued)

*Primary Examiner* — Amber R Orlando
*Assistant Examiner* — Britanny Precht

(57) ABSTRACT

A heated filter assembly for heating gas supplied to a substrate processing system includes a housing defining a cavity, an inner surface and an outer surface. A filter element is arranged inside the cavity of the housing with an outer surface thereof in a spaced relationship relative to the inner surface of the housing. A heat transfer element is arranged inside of the filter element and includes an outer surface and an inner cavity. A plurality of projections is arranged on the outer surface of the heat transfer element in direct physical contact with an inner surface of the filter element. A plurality of portions is arranged on the outer surface of the heat transfer element, is spaced from the inner surface of the filter element and is located between the plurality of projections.

17 Claims, 4 Drawing Sheets

(56) References Cited

U.S. PATENT DOCUMENTS

| | | | | |
|---|---|---|---|---|
| 6,540,816 B2* | 4/2003 | Allie | ............... | F01N 3/0211 |
| | | | | 156/210 |
| 8,252,077 B2* | 8/2012 | Gonze | ............... | F01N 3/027 |
| | | | | 55/282.3 |
| 2005/0050870 A1* | 3/2005 | Cheng | ............... | B01D 46/244 |
| | | | | 55/523 |
| 2007/0039298 A1* | 2/2007 | Tokumaru | ............... | B01D 46/2418 |
| | | | | 55/523 |
| 2009/0084315 A1* | 4/2009 | Liu | ............... | C23C 16/4402 |
| | | | | 118/715 |
| 2010/0316404 A1* | 12/2010 | Fukuzawa | ............... | G03G 15/205 |
| | | | | 399/69 |
| 2011/0056961 A1* | 3/2011 | Amtmann | ............... | F01N 3/2066 |
| | | | | 220/592.01 |
| 2011/0283895 A1* | 11/2011 | Veltrop | ............... | A23L 3/005 |
| | | | | 99/451 |
| 2013/0014494 A1* | 1/2013 | Lee | ............... | B01D 46/2418 |
| | | | | 60/311 |
| 2013/0267100 A1* | 10/2013 | Takagi | ............... | C23C 16/4485 |
| | | | | 438/758 |
| 2015/0158016 A1* | 6/2015 | Mori | ............... | F01N 3/2026 |
| | | | | 422/174 |

* cited by examiner

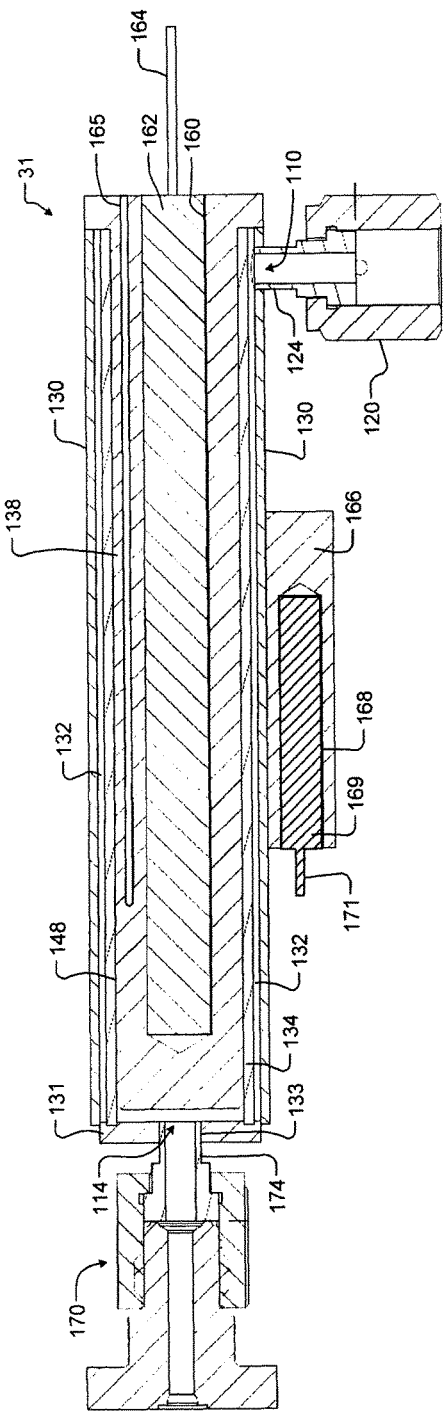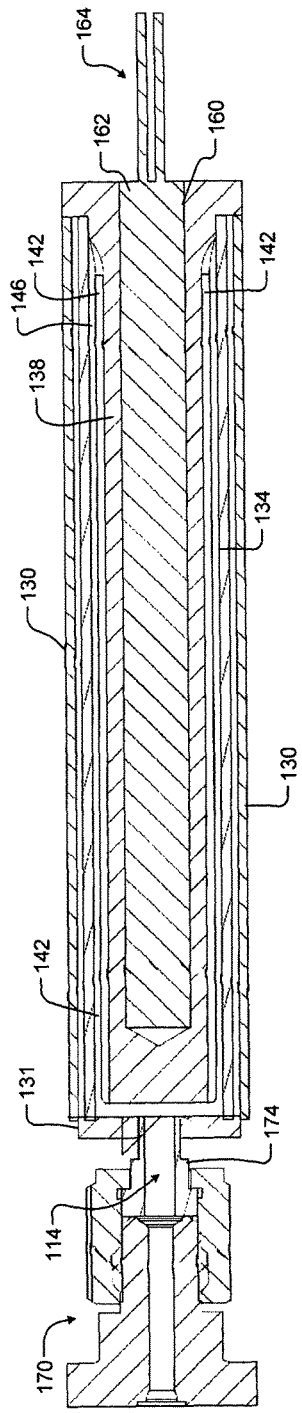

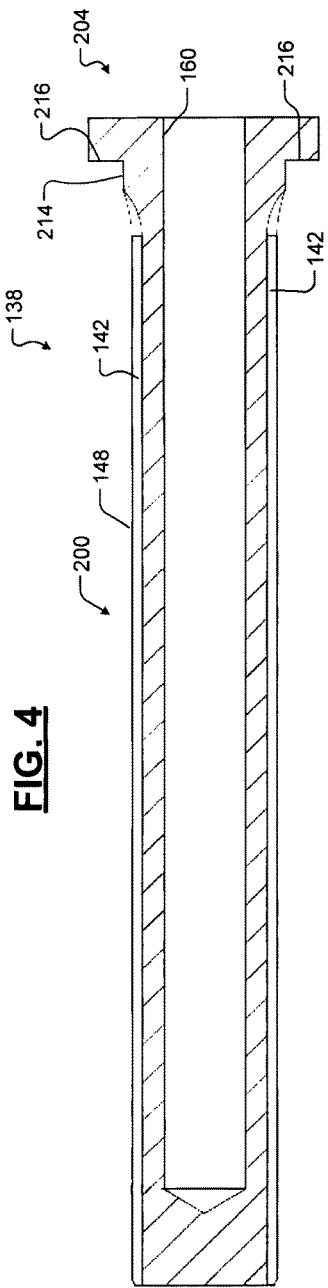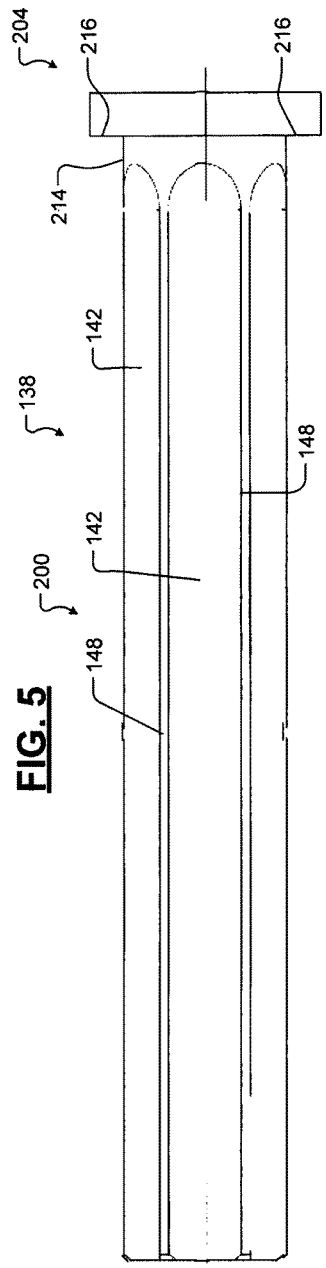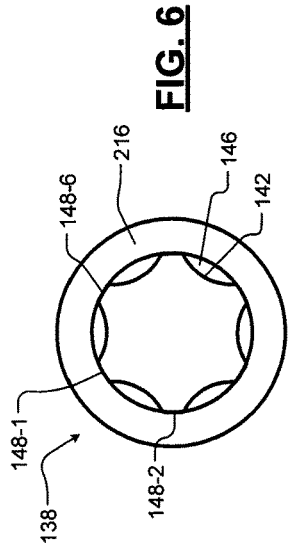

INTERNALLY HEATED POROUS FILTER FOR DEFECT REDUCTION WITH LIQUID OR SOLID PRECURSORS

CROSS-REFERENCE TO RELATED APPLICATIONS

This application claims the benefit of U.S. Provisional Application No. 62/061,342, filed on Oct. 8, 2014. The entire disclosure of the application referenced above is incorporated herein by reference.

FIELD

The present disclosure relates to substrate processing systems, and more particularly to filters for filtering precursor delivered to substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform deposition and/or etching of film on a substrate such as a semiconductor wafer. Substrate processing systems typically include a processing chamber with a substrate support such as a pedestal, an electrostatic chuck, a plate, etc. A substrate such as a semiconductor wafer may be arranged on the substrate support. During chemical vapor deposition (CVD) and atomic layer deposition (ALD) processes, a gas mixture including one or more precursors may be introduced into the processing chamber to deposit a film on the substrate. In some substrate processing systems, plasma may be used to activate chemical reactions. To obtain high quality film, it is important to deliver the precursor gas to the processing chamber at a desired temperature, a high uniformity, and with high purity. Gas mixtures are obtained by some combination of gases, vaporized liquids, and sublimed solids. Vaporized liquids, in particular, are almost always incompletely vaporized, and the resultant vapor contains liquid droplets of varying sizes. Unvaporized droplets cause wafer defects.

Heated filters may be used to heat and filter the precursor gas before delivery to the processing chamber. In addition, the heated filter can also prevent the unvaporized liquid droplets from entering the chamber due to pore size. Heated filters typically use one or more filter elements that are arranged inside a filter housing. An external heater jacket may be arranged around the filter housing to heat the filter element. When heating the filter element, heat travels through the filter housing to the center of the filter via convection or conduction. The mean heat conduction path for a typical heated filter is approximately 10" through a $\frac{1}{16}$" porous wall, which also has a much lower thermal conductivity than its solid analogue. In addition, usually there is no direct conductive path from the filter element to the temperature monitoring and control system.

When using this heated filter arrangement, there is a large heating time lag due to the lack of direct contact between the heater and the temperature monitoring and control system. The time lag causes large temperature swings. Too much heat may cause thermal decomposition of precursors while too little heat may cause precursor condensation.

The filters are prone to clogging due to byproducts of decomposition clogging pores of the filter elements. The filters are also prone to clogging due to droplets diffusing through the filter element by capillary action and when the filter element cannot provide enough heat to vaporize the droplets. Other challenges include incomplete purging of atmospheric moisture due to poor and lagging thermal control, which increases clogging. Currently, the filter needs to be purged for 48 hours with inert gas prior to introducing precursor.

Additionally, it is difficult to maintain the required operating temperature as gases expand and cool down. When the gases cool down, heat is removed from the filter and the likelihood of precursor condensation increases. Furthermore, it is difficult to compensate for cold spots as droplets strike the filter element and remove heat.

SUMMARY

A heated filter assembly for heating gas supplied to a substrate processing system includes a housing defining a cavity, an inner surface and an outer surface. A filter element is configured to filter the gas and includes an inner surface and an outer surface. The filter element is arranged inside the cavity of the housing with the outer surface thereof in a spaced relationship relative to the inner surface of the housing. A heat transfer element is arranged inside of the filter element and includes an outer surface and an inner cavity. A plurality of projections is arranged on the outer surface of the heat transfer element in direct physical contact with the inner surface of the filter element. A plurality of portions is arranged on the outer surface of the heat transfer element, is spaced from the inner surface of the filter element and is located between the plurality of projections.

In other features, a heater is arranged in the inner cavity of the heat transfer element. The filter element comprises a porous metal filter. The plurality of projections of the heat transfer element includes axially elongated projections. The plurality of portions of the heat transfer element includes axially elongated scalloped portions.

In other features, an end cap is arranged adjacent to first ends of the housing and the filter element. The end cap is configured to maintain the spaced relationship between the housing and the filter element. The housing includes a gas inlet in fluid communication with a cylindrical space between the inner surface of the housing and the outer surface of the filter element. The end cap includes a gas outlet in fluid communication with the inner surface of the filter element.

In other features, the heat transfer element includes a body portion and a flanged portion extending from an end of the body portion. The heat transfer element and the housing abut the flanged portion of the heat transfer element. The housing and the filter element are made of a heat conducting material.

In other features, a secondary heat transfer element includes a heater that is attached to the outer surface of the housing. The heater of the secondary heat transfer element comprises a heater cartridge.

In other features, the filter element, the housing, and the heat transfer element have generally cylindrical cross-sections. The heat transfer element includes a bore configured to receive a thermocouple.

In other features, the gas enters the gas inlet, passes through the filter element and is directed between the plurality of projections along the plurality of portions to the gas outlet.

In other features, the heater of the heat transfer element comprises a heater cartridge. A cylindrical space is defined between the outer surface of the filter element and the inner surface of the housing.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2 is a cross-sectional view of an example of a heater filter according to the present disclosure;

FIG. 3 is another cross-sectional view of the heater filter of FIG. 2 according to the present disclosure;

FIG. 4 is a cross-sectional view of an example of an inner heat transfer element according to the present disclosure;

FIG. 5 is a side view of the inner heat transfer element of FIG. 4 according to the present disclosure;

FIG. 6 is an end view of the inner heat transfer element of FIG. 4 according to the present disclosure;

In the drawings, reference numbers may be reused to identify similar and/or identical elements.

DETAILED DESCRIPTION

The heated filter according to the present disclosure is able to stay at a much more uniform and stable temperature during operation. As a result, the heater provides more uniform heating of precursor gas supplied to a substrate processing system and improved defect reduction. The heated filter provides dynamic monitoring and control of the temperature of the filter element as operating conditions change with very small time lag. The heated filter includes a heat transfer element that connects the thermal mass of the filter element directly to both the heater and a temperature monitoring and control system. As a result, the heat from the heater has a direct and very short path to the filter element (in some examples, less than 0.5"). In addition, there is no significant geometrical limitation on maximum heat flux. As a result, the filter element can provide enough heat to stay at the operating temperature while also providing enough heat to vaporize impinging droplets and prevent clogging.

More particularly, the heater arranged in the heat transfer element has a short and direct heating path to the filter element. Most traditional heaters rely on heater jackets arranged on the outside of the housing and therefore have a very long heating path (>10"). The heated filter according to the present disclosure can quickly heat the filter element while preventing temperature overshoot. The heated filter also shortens purging, maintenance, and replacement times from days to hours. In addition, the filter element can be maintained at the desired temperature regardless of convection to cold gases or liquid droplets. The heated filter also has the ability to precisely control the temperature of the filter element in real time to reduce or prevent precursor decomposition and condensation.

Figure 1:
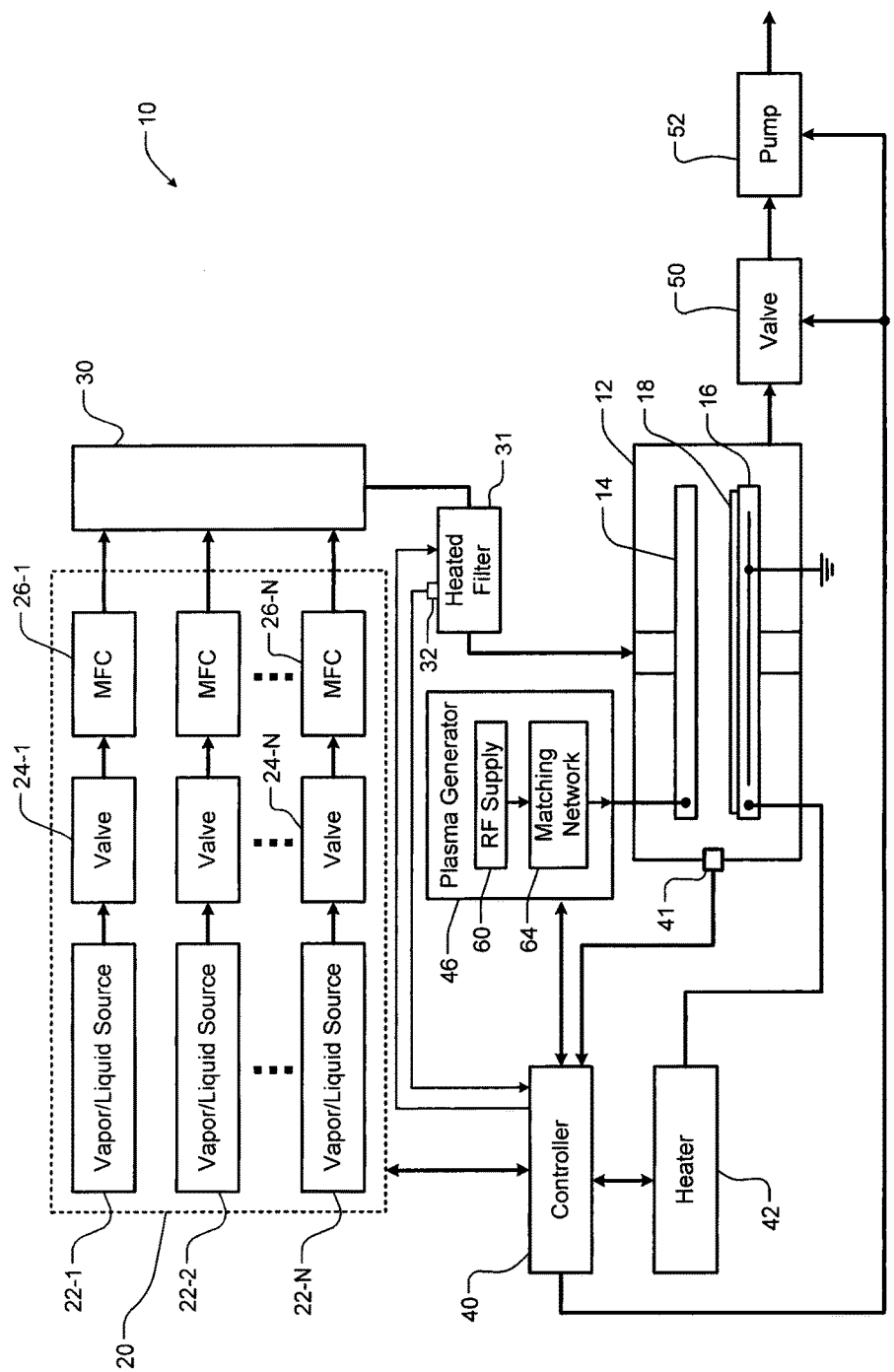
FIG. 1 is a functional block diagram of an example of a substrate processing system including a heated filter.

Referring now to FIG. 1, an example of a substrate processing system 10 is shown. While the substrate processing system 10 in FIG. 1 relates to PECVD or PEALD systems, the heated filter may be used in other processes requiring heated precursor gas. The substrate processing system 10 includes a processing chamber 12. Gas may be supplied to the processing chamber 12 using a gas distribution device 14 such as showerhead or other device. A substrate 18 such as a semiconductor wafer may be arranged on a substrate support 16 during processing. The substrate support 16 may include a pedestal, an electrostatic chuck, a mechanical chuck or other type of substrate support.

A gas delivery system 20 may include one or more vapor/liquid sources 22-1, 22-2, . . . , and 22-N (collectively vapor/liquid sources 22), where N is an integer greater than one. Valves 24-1, 24-2, . . . , and 24-N (collectively valves 24), mass flow controllers 26-1, 26-2, . . . , and 26-N (collectively mass flow controllers 26), or other flow control devices may be used to controllably supply precursor, reactive gases, inert gases, purge gases, and mixtures thereof to a manifold 30, which supplies the gas mixture to the processing chamber 12. A heated filter 31 may be arranged between the manifold and the processing chamber 12. Alternately, one or more heated filters 31 may be arranged between the MFC 26 and the manifold 30. In some examples, one or more of the vapor/liquid sources 22 may include a heated ampoule including liquid or solid precursor. Carrier gas is supplied to the heated ampoule by a valve. Another valve supplies a mixture of the carrier gas and the precursor that is sublimated or evaporated. A thermocouple 32 may be connected to a controller 40 and used to control a temperature of the heated filter 31 using a heater described further below.

The controller 40 may be used to monitor process parameters such as temperature, pressure etc. (using sensors 41) and to control process timing. The controller 40 may be used to control process devices such as the gas delivery system 20, a pedestal heater 42, and/or a plasma generator 46. The controller 40 may also be used to evacuate the processing chamber 12 using a valve 50 and pump 52.

The plasma generator 46 generates the plasma in the processing chamber. The plasma generator 46 may be an inductive or capacitive-type plasma generator. In some examples, the plasma generator 46 may include an RF power supply 60 and a matching and distribution network 64. Alternately, microwave power may be used to generate the plasma. While the plasma generator 46 is shown connected to the gas distribution device 14 with the pedestal grounded or floating, the plasma generator 46 can be connected to the substrate support 16 and the gas distribution device 14 can be grounded or floating. While plasma is generated between the showerhead and the pedestal in FIG. 1, remote plasma may be used.

Referring now to FIGS. 2 and 3, the heated filter 31 is shown in additional detail. The heated filter 31 includes an inlet 110 and an outlet 114. The heated filter 31 may include an inlet adapter 120 including one or more inlet fittings 124. The heated filter 31 further includes a housing 130. In some examples, the housing 130 has a cylindrical shape. An end cap 131 is arranged at one end of the housing 130 and includes a bore 133 corresponding to the outlet 114. The heated filter 31 further includes a filter element 134 connected at one end to the end cap 131. A radially outer surface of the filter element 134 is spaced from a radially inner surface of the housing 130 define a space 132 therebetween. Precursor gas is delivered into the space 132 via the inlet 110.

A heat transfer element 138 is inserted into a cavity defined inside a radially inner surface of the filter element 134. The heat transfer element 138 extends substantially the same length as the filter element 134. In some examples, the heat transfer element 138 may be "T"-shaped. The heat transfer element 138 may have a cylindrical body and an end portion including a flange that extends radially outwardly. A radially outer surface of the heat transfer element 138 may include a plurality of elongated scalloped surfaces or portions 142 (as can be seen in FIG. 3) that define a space 146 between the filter element 134 and the heat transfer element 138. Elongated raised portions 148 of the heat transfer element 138 (as can be seen in FIG. 2) extending axially between the plurality of scalloped portions 142 are in direct contact with the radially inner surface of the filter element 134 to provide heat transfer as will be described further below.

A first bore 160 extends in an axial direction at a radial center of the heat transfer element 138 to allow a heater 162 such as a cartridge heater to be inserted into the bore to heat the heat transfer element 138. A connection 164 may be provided to control the heater 162. A second bore 165 likewise extends in an axial direction spaced from the radial center of the heat transfer element 138 to allow the thermocouple 32 or temperature sensor to be inserted into the heat transfer element 138 to determine a temperature of the heat transfer element 138.

An outer heat transfer element 166 may be connected to a radially outer surface of the housing 130. A first bore 168 may be provided in the outer heat transfer element 166 to receive a heater 169 (with connector 171) to heat the housing 130. In some examples, the heater 169 is a cartridge heater. A thermocouple (not shown) may also be provided to determine a temperature of the heat transfer element 166. An outlet adapter 170 including one or more outlet fittings 174 may be used to connect the heated filter 31 to the processing chamber of the substrate processing system.

During operation, precursor gas flows through the inlet 110 and into the space 132. The precursor gas flows through the filter element 134 into the plurality of scalloped portions 142. The precursor gas flows along the scalloped portions 142 to the outlet 114. The temperature of the heated filter 31 is controlled in a uniform manner by heating the heat transfer element 138 using the heater 162. The heat transfer element 138 is in direct contact with the filter element 134 via the raised portions 148. More particularly, the raised portions 148 extend axially substantially the entire length of the filter element 134 to provide uniform heating of the filter element 134. Likewise, the temperature of the housing 130 may be controlled in a uniform manner by the heater 169.

Referring now to FIGS. 4-6, the heat transfer element 138 is shown in further detail. In FIGS. 4 and 5, the heat transfer element 138 may have a "T"-shaped cross-section with a cylindrical body portion 200 that extends substantially the same length as the filter element 134 and an end portion 204. In some examples, the end portion 204 includes an inner cylindrical surface 214 (adjacent to the cylindrical body portion 200) for receiving one end of the filter element 134 and a flanged portion 216 that projects radially outwardly from the cylindrical body portion 200. In FIG. 6, the raised portions 148 are shown extending outwardly to a radially outer surface of the cylindrical body portion 200 at a plurality of locations (e.g. 148-1, 148-2, . . . ) to provide physical contact with the radially inner surface of the filter element 134 to provide heat transfer. In some examples, there are N scalloped portions 142 and N raised portions 148 in contact with the radially inner surface of the filter element 134. In some examples, N is equal to 6, although N may be greater than 3, 4, 5, etc.

Figure 7:
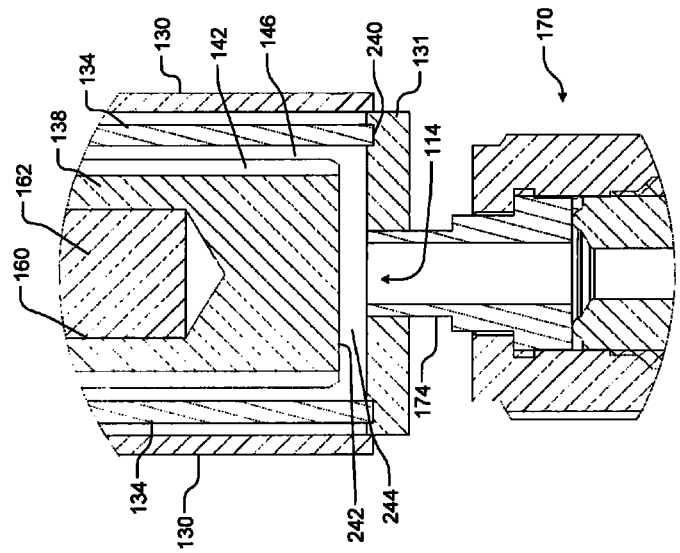
FIG. 7 is a partial, cross-sectional view of one end of the heated filter of FIG. 3 according to the present disclosure.
Figure 8:
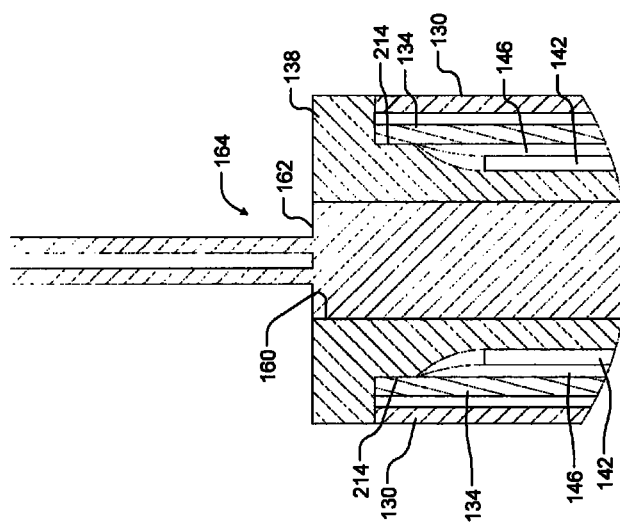
FIG. 8 is another partial, cross-sectional view of another end of the heated filter of FIG. 3 according to the present disclosure.

Referring now to FIGS. 7 and 8, additional details relating to the heat transfer element 138 are shown at opposite ends of the heated filter 31, respectively. In FIG. 7, the scalloped portions 142 of the heat transfer element 138 terminate adjacent to the inner cylindrical surface 214 near an end of the filter element 134. The inner cylindrical surface 214 locates and maintains a position of one end of the filter element 134. In some examples, an outer diameter of the inner cylindrical surface 214 is substantially equal to an inner diameter of the filter element 134. An end of the housing 130 may be welded or otherwise attached to the flanged portion 216 of the heat transfer element 138.

In FIG. 8, the end cap 131 is shown to include a circular slot 240 on an inner surface thereof for receiving the opposite end of the filter element 134. The circular slot 240 locates and maintains a position of the opposite end of the filter element 134. The end cap 131 may be welded or otherwise attached to an opposite end of the housing 130. An end portion 242 of the heat transfer element 138 is spaced from the end cap 131 to provide a cavity 244 adjacent to the outlet 114. The precursor gas flowing in the space 146 flows to the cavity 244 and through the outlet 114.

In some examples, the filter element 134 is a porous metal filter. In some examples, the housing 130, the end cap 131 and/or the heat transfer element 138 are made of a heat conducting material such as metal. In some examples, the housing 130 and the end cap 131 are made of stainless steel and the heat transfer element 138 is made of aluminum, although other materials may be used.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term 'controller' may be replaced with the term 'circuit.' The term 'controller' may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The controller may include one or more interface circuits. In some examples, the interface circuits may include wired or wireless interfaces that are connected to a local area network (LAN), the Internet, a wide area network (WAN), or combinations thereof. The functionality of any given controller of the present disclosure may be distributed among multiple controllers that are connected via interface circuits. For example, multiple controllers may allow load balancing. In a further example, a server (also known as remote, or cloud) controller may accomplish some functionality on behalf of a client controller.

The term code, as used above, may include software, firmware, and/or microcode, and may refer to programs, routines, functions, classes, data structures, and/or objects. The term shared processor circuit encompasses a single processor circuit that executes some or all code from multiple controllers. The term group processor circuit encompasses a processor circuit that, in combination with additional processor circuits, executes some or all code from one or more controllers. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple controllers. The term group memory circuit encompasses a memory circuit that, in combination with additional memories, stores some or all code from one or more controllers.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. §112(f) unless an element is expressly recited using the phrase "means for," or in the case of a method claim using the phrases "operation for" or "step for."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A heated filter assembly for heating gas supplied to a substrate processing system, comprising:
   a housing defining a cavity, an inner surface and an outer surface;
   a filter element configured to filter the gas and including an inner surface and an outer surface, wherein the filter element is arranged inside the cavity of the housing with the outer surface of the filter element in a spaced relationship relative to the inner surface of the housing; and
   a heat transfer element that is arranged inside of the filter element and that includes:
   an outer surface;
   an inner cavity;
   a plurality of projections arranged on the outer surface of the heat transfer element in direct physical contact with the inner surface of the filter element; and
   a plurality of portions that are arranged on the outer surface of the heat transfer element, that are spaced from the inner surface of the filter element and that are located between the plurality of projections.

2. The heated filter assembly of claim 1, further comprising a heater arranged in the inner cavity of the heat transfer element.

3. The heated filter assembly of claim 1, wherein the filter element comprises a porous metal filter.

4. The heated filter assembly of claim 1, wherein the plurality of projections of the heat transfer element includes axially elongated projections and the plurality of portions of the heat transfer element includes axially elongated scalloped portions.

5. The heated filter assembly of claim 1, further comprising an end cap arranged adjacent to first adjacent ends of the housing and the filter element.

6. The heated filter assembly of claim 5, wherein the end cap is configured to maintain the spaced relationship between the housing and the filter element.

7. The heated filter assembly of claim 5, wherein the housing includes a gas inlet in fluid communication with a cylindrical space between the inner surface of the housing and the outer surface of the filter element and the end cap includes a gas outlet in fluid communication with the inner surface of the filter element.

8. The heated filter assembly of claim 5, wherein the heat transfer element includes a cylindrical body portion and a flanged portion extending from one end of the cylindrical body portion, and wherein the heat transfer element and the housing abut the flanged portion of the heat transfer element.

9. The heated filter assembly of claim 1, wherein the housing and the filter element are made of a heat conducting material.

10. The heated filter assembly of claim 1, further comprising a secondary heat transfer element including a heater that is attached to the outer surface of the housing.

11. The heated filter assembly of claim 10, wherein the heater of the secondary heat transfer element comprises a heater cartridge.

12. The heated filter assembly of claim 1, wherein the housing, the filter element and the heat transfer element have generally cylindrical cross-sections.

13. The heated filter assembly of claim 1, wherein the heat transfer element includes a bore configured to receive a thermocouple.

14. The heated filter assembly of claim 7, wherein the gas enters the cylindrical space through the gas inlet, passes from the cylindrical space through the filter element and is directed between the plurality of projections along the plurality of portions to the gas outlet.

15. The heated filter assembly of claim 2, wherein the heater of the heat transfer element comprises a heater cartridge.

16. The heated filter assembly of claim 1, wherein a cylindrical space is defined between the outer surface of the filter element and the inner surface of the housing.

17. The heated filter assembly of claim 1, wherein the plurality of projections and the plurality of portions extend axially along a body of the heat transfer element.

* * * * *